United States Patent [19]

Quek et al.

[11] Patent Number: 5,744,853
[45] Date of Patent: Apr. 28, 1998

[54] THREE DIMENSIONAL POLYSILICON CAPACITOR FOR HIGH DENSITY INTEGRATED CIRCUIT APPLICATIONS

[75] Inventors: Elgin Kiok Boone Quek; Yang Pan, both of Singapore, Singapore

[73] Assignee: Chartered Semiconductor Manufacturing PTE LTD, Singapore, Singapore

[21] Appl. No.: 810,794

[22] Filed: Mar. 5, 1997

Related U.S. Application Data

[63] Continuation of Ser. No. 529,023, Sep. 15, 1995, abandoned.

[51] Int. Cl.[6] .................. H01L 29/68; H01L 27/04; H01L 27/108; H01L 29/78
[52] U.S. Cl. .................. 257/532; 257/296; 257/304; 257/307; 257/756; 257/748; 257/755; 257/754; 257/906; 438/210; 438/394
[58] Field of Search .................. 257/754–759, 257/768, 769, 532, 296, 297, 298, 304, 308, 307, 306, 904, 906; 437/60; 438/210, 394

[56] References Cited

U.S. PATENT DOCUMENTS

| | | | |
|---|---|---|---|
| 4,860,085 | 8/1989 | Feygenson | 257/755 |
| 5,155,657 | 10/1992 | Oehrlein et al. | 257/298 |
| 5,173,437 | 12/1992 | Chi | 437/60 |
| 5,223,730 | 6/1993 | Rhodes et al. | 257/304 |
| 5,262,662 | 11/1993 | Gonzalez et al. | 357/308 |
| 5,266,513 | 11/1993 | Fazan et al. | 437/52 |
| 5,272,367 | 12/1993 | Dennison et al. | 257/306 |
| 5,321,649 | 6/1994 | Lee et al. | 257/306 |
| 5,357,136 | 10/1994 | Yoshioka | 257/757 |
| 5,396,456 | 3/1995 | Liu et al. | 257/304 |
| 5,506,166 | 4/1996 | Sandhu et al. | 437/60 |

FOREIGN PATENT DOCUMENTS

| | | | |
|---|---|---|---|
| 0015951 | 1/1985 | Japan | 257/755 |
| 0029484 | 2/1994 | Japan | 257/754 |
| 6-97386 | 4/1994 | Japan . | |

*Primary Examiner*—Wael Fahmy
*Assistant Examiner*—Alexander Oscar Williams
*Attorney, Agent, or Firm*—George O. Saile; Stephen B. Ackerman; Alek P. Szecsy

[57] ABSTRACT

A three-dimensional polysilicon capacitor for use within integrated circuits and a method by which the three-dimensional polysilicon capacitor is formed. Formed upon a semiconductor substrate is a first polysilicon layer which has a series of apertures formed at least partially through the first polysilicon layer. A conformal insulator layer is then formed upon the first polysilicon layer and into the apertures within the first polysilicon layer. The conformal insulator layer has a series of apertures corresponding to the series of apertures within the first polysilicon layer. A second polysilicon layer is then formed upon the surface of the conformal insulator layer and filling the apertures within the conformal insulator layer. Optionally, the first polysilicon layer may be formed from a multi-coating stack comprising two polysilicon coatings separated by an metal silicide etch stop layer.

20 Claims, 6 Drawing Sheets

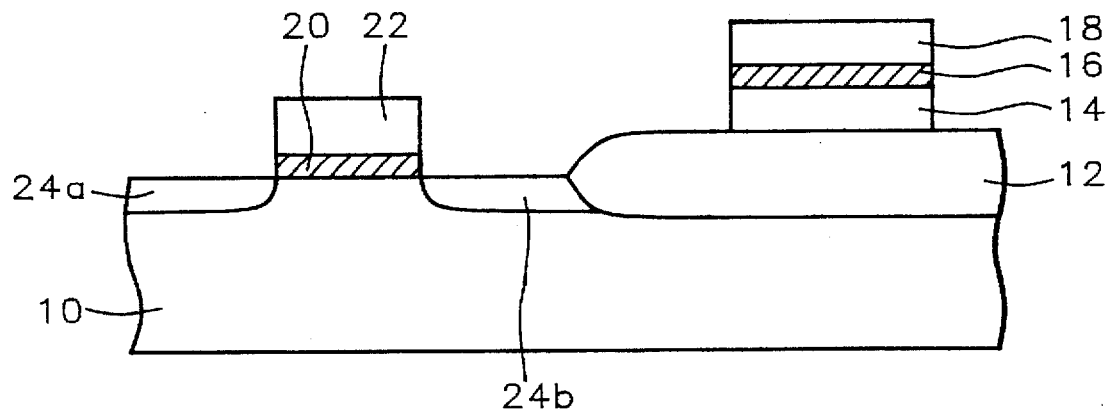
FIG. 1 - Prior Art
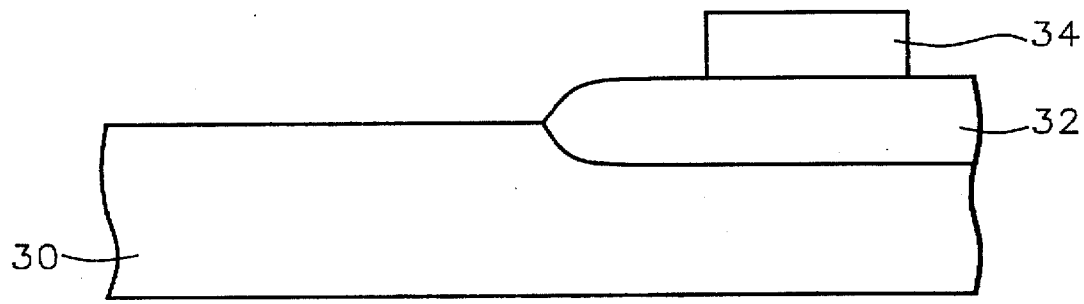
FIG. 2a
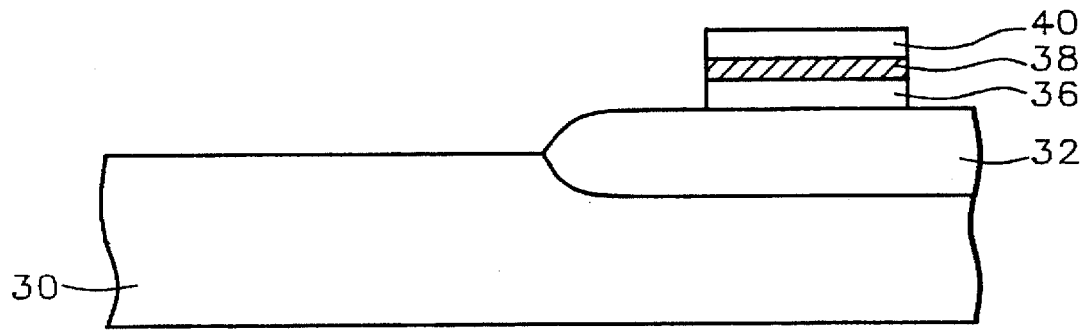
FIG. 2b

1

THREE DIMENSIONAL POLYSILICON CAPACITOR FOR HIGH DENSITY INTEGRATED CIRCUIT APPLICATIONS

CROSS-REFERENCE TO RELATED APPLICATION

This application is a file wrapper continuation application of application Ser. No. 08/529,023, filed 15 Sep. 1995, now abandoned.

BACKGROUND OF THE INVENTION

1. Field of the Invention

The present invention relates generally to capacitors formed within integrated circuits. More particularly, the present invention relates to a three-dimensional polysilicon capacitor for use within high density integrated circuits.

2. Description of Related Art

Integrated circuits are typically fabricated from semiconductor substrates upon and within whose surfaces are formed resistors, transistors, diodes and other electrical circuit elements. These electrical circuit elements are connected internally and externally to the semiconductor substrate upon which they are formed through conductor layers which are separated by insulator layers.

In addition to the use of transistors as switching elements within integrated circuits, and the use of resistors as electrical circuit load elements within integrated circuits, capacitors are also commonly employed within integrated circuits. Typically, capacitors within integrated circuits are employed as charge storage elements within digital integrated circuits or as passive electrical circuit elements within analog integrated circuits.

A common method for forming capacitors within integrated circuits is to form upon a semiconductor substrate two doped polysilicon layers which are separated by an insulating layer. A capacitor formed through this method is referred to as a planar polysilicon capacitor. A typical planar polysilicon capacitor within an integrated circuit is illustrated within the cross-sectional schematic diagram shown in FIG. 1.

FIG. 1 shows a semiconductor substrate 10 within and upon whose surface is formed a Field OXide (FOX) isolation region 12. The FOX isolation region 12 defines the active semiconductor region of the semiconductor substrate 10. Within the active semiconductor region may be formed transistors, resistors, diodes and other electrical circuit elements. For example, FIG. 1 illustrates a field effect transistor structure formed within the active semiconductor region. The field effect transistor structure comprises a gate electrode 22 which resides upon a gate oxide 20, and a pair of source/drain electrodes 24a and 24b.

Typically, planar polysilicon capacitors within integrated circuits are formed upon the surfaces of FOX isolation regions within those integrated circuits. Thus, within FIG. 1, a conventional planar polysilicon capacitor is illustrated by a first polysilicon layer 14 and a second polysilicon layer 18 separated by an insulating layer 16, all of which layers are formed upon the surface of the FOX isolation region 12.

As integrated circuit technology has advanced, with continuing concomitant decreases in integrated circuit dimensions, available semiconductor substrate surface area for all varieties of electrical circuit elements within those integrated circuits has continued to decrease. Conflicting with the trend towards decreasing electrical circuit element dimensions is the simultaneous trend towards increased electrical performance of electrical circuit elements within those integrated circuits. Although the electrical performance of some types of electrical circuit elements may be maintained or increased while the dimensions of those electrical circuit elements are decreased, the electrical performance of other types of electrical circuit elements is fundamentally compromised when feature sizes of those electrical circuit elements are decreased.

Such a fundamental compromise arises in the design of planar polysilicon capacitors for advanced integrated circuits, since the capacitance of a planar polysilicon capacitor is directly related to the surface area of the insulator layer and polysilicon conductor layers from which planar polysilicon capacitors are formed. Thus, the present invention is directed towards the problem of maintaining and increasing the capacitance of planar polysilicon capacitors within advanced integrated circuits which have decreasing available semiconductor substrate surface area for those planar polysilicon capacitors.

The design and fabrication of planar polysilicon capacitors are known in the art. For example, Chi in U.S. Pat. No. 5,173,437 describes a method for forming a double layer planar polysilicon capacitor compatible with sub-micron processing schemes for advanced integrated circuits. The disclosed method provides a planar polysilicon capacitor which is not susceptible to formation of polysilicon stringers which deteriorate the electrical performance of planar polysilicon capacitors and the advanced integrated circuits into which those planar polysilicon capacitors are formed.

Desirable in the art is a method whereby polysilicon capacitors of reduced surface area in comparison with conventional planar polysilicon capacitors may be formed within advanced integrated circuits while simultaneously maintaining or increasing the capacitance of those polysilicon capacitors.

SUMMARY OF THE INVENTION

A first object of the present invention is to provide a method for forming a polysilicon capacitor within an advanced integrated circuit, which polysilicon capacitor has a reduced surface area in comparison with conventional planar polysilicon capacitors while simultaneously maintaining or increasing the capacitance of the polysilicon capacitor.

A second object of the present invention is to provide a method in accord with the first object of the present invention, which method is also manufacturable.

A third object of the present invention is to provide a method in accord with the first object of the present invention and the second object of the present invention, which method is also economical.

In accord with the objects of the present invention, a new method for forming a polysilicon capacitor within an integrated circuit is disclosed along with the polysilicon capacitor structure which results from that method. To form the polysilicon capacitor of the present invention a first polysilicon layer is formed upon a semiconductor substrate. The first polysilicon layer has a series of apertures formed at least partially through the first polysilicon layer. Formed conformally upon the first polysilicon layer and conformally into the apertures within the first polysilicon layer is a conformal insulator layer. The conformal insulator layer has a second series of apertures formed therein corresponding to locations where the conformal insulator layer is formed into the series of apertures within the first polysilicon layer. Finally, there is formed upon the conformal insulator layer and completely filling the second series of apertures within the conformal insulator layer a second polysilicon layer.

The method of the present invention provides a three-dimensional polysilicon capacitor for use within an integrated circuit, which three dimensional polysilicon capacitor may have a reduced surface area in comparison with conventional planar polysilicon capacitors while simultaneously maintaining or increasing the capacitance of the three-dimensional polysilicon capacitor. Through the method of forming a series of apertures at least partially through the first polysilicon layer and forming into the series of apertures a conformal insulator layer, the three-dimensional polysilicon capacitor of the present invention provides a greater capacitance in an equal or smaller semiconductor substrate surface area than planar polysilicon capacitors conventional to the art.

The three dimensional polysilicon capacitor of the present invention is readily manufacturable. The three-dimensional polysilicon capacitor of the present invention is manufactured through forming a series of apertures into the first polysilicon layer of the three-dimensional polysilicon capacitor of the present invention. Methods through which polysilicon layers may be patterned with a series of apertures are well known in the art. Such methods provide a readily manufacturable process for the three-dimensional polysilicon capacitor of the present invention.

The three dimensional polysilicon capacitor of the present invention is economical. In comparison with conventional planar polysilicon capacitors, the three dimensional polysilicon capacitor of the present invention requires only the additional process steps needed for forming a series of apertures at least partially through the first polysilicon layer of the three-dimensional polysilicon capacitor of the present invention. In circumstances where the first polysilicon layer of the three-dimensional polysilicon capacitor of the present invention is formed simultaneously with other electrical circuit elements within the integrated circuit within which is formed the three-dimensional polysilicon capacitor of the present invention, no additional process steps may be needed in forming the three dimensional polysilicon capacitor of the present invention. Even under circumstances where a limited number of additional process steps are required to form the three-dimensional polysilicon capacitor of the present invention, forming the three-dimensional polysilicon capacitor of the present invention is economical.

BRIEF DESCRIPTION OF THE DRAWINGS

The following drawings, which form a material part of this disclosure, show the following:

FIG. 1 shows a schematic cross-sectional diagram illustrating a planar polysilicon capacitor of the prior art.

FIGS. 2a–2b to FIG. 3a–5c show schematic cross-sectional diagrams illustrating progressive process steps in forming three-dimensional polysilicon capacitors in accord with the three preferred embodiments of the present invention.

DESCRIPTION OF THE PREFERRED EMBODIMENTS

Figure 3A:
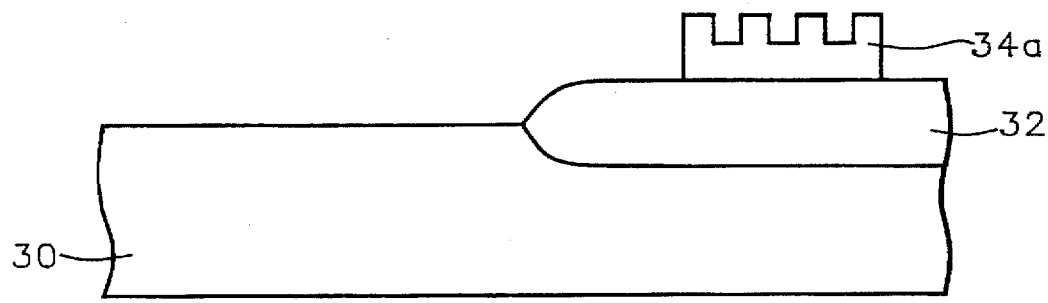

The method of the present invention provides a three-dimensional polysilicon capacitor possessing an increased capacitance per unit surface area in comparison with planar polysilicon capacitors conventional to the art. The three-dimensional polysilicon capacitor of the present invention is applicable in advanced integrated circuits which provide limited semiconductor substrate surface area for polysilicon capacitor structures. In such applications, the three-dimensional polysilicon capacitor of the present invention provides an equal or greater capacitance than conventional planar polysilicon capacitors.

Although the three-dimensional polysilicon capacitor of the present invention is most likely to replace planar polysilicon capacitors formed within analog integrated circuits, the three-dimensional polysilicon capacitor of the present invention has broad applicability within integrated circuits. The three-dimensional polysilicon capacitor of the present invention may be employed in any integrated circuit where there is needed the high capacitance provided by the three-dimensional polysilicon capacitor of the present invention within a limited semiconductor substrate surface area.

Referring now to FIG. 2a to FIG. 5c there is shown a series of schematic cross-sectional diagrams illustrating progressive process steps in forming the three preferred embodiments of the three-dimensional polysilicon capacitor of the present invention. Shown in FIG. 2a and FIG. 2b are schematic cross-sectional diagrams which illustrate the early process steps in forming the three-dimensional polysilicon capacitors which form the three preferred embodiments of the present invention.

Shown in FIG. 2a and FIG. 2b is a semiconductor substrate 30 within and upon whose surface is formed a Field OXide (FOX) isolation region 32 which defines the active region of the semiconductor substrate 30. Although the present invention may be practiced upon semiconductor substrates of either dopant polarity, any dopant concentration and any crystallographic orientation, the present invention will typically be practiced upon an N- or P-silicon semiconductor substrate having a (100) crystallographic orientation.

The definition of active semiconductor regions upon semiconductor substrates through formation of FOX isolation regions is conventional to the art. FOX isolation regions may be formed through methods including but not limited to thermal oxidation methods whereby portions of a semiconductor substrate exposed through a suitable mask are oxidized to form FOX isolation regions within and upon the semiconductor substrate, and methods whereby a layer of a suitable insulating material is deposited upon a semiconductor substrate and patterned to form FOX isolation regions. For the three preferred embodiments of the present invention, the FOX isolation region 32 is preferably formed through a thermal oxidation process whereby a portion of the semiconductor substrate 30 exposed through a LOCal Oxidation of Silicon (LOCOS) oxidation mask is thermally oxidized.

Also shown in FIG. 2a is a first polysilicon layer 34 formed upon the surface of the FOX isolation region 32. As is shown in FIG. 2a, the first polysilicon layer 34 is formed upon the FOX isolation region 32 only, without contacting the semiconductor substrate 30. The first polysilicon layer 34 is the first critical element from which two of the three preferred embodiments of the three-dimensional polysilicon capacitor of the present invention are formed. Methods and materials through which polysilicon layers may be formed within integrated circuits are known in the art. Polysilicon layers may be formed through methods including but not limited to Chemical Vapor Deposition (CVD) methods and Plasma Enhanced Chemical Vapor Deposition (PECVD) methods. Suitable silicon source materials through which polysilicon layers may be formed through these methods include but are not limited to silane, disilane and silicon chloride.

Polysilicon layers within integrated circuits may also be doped to achieve desired electrical characteristics. Doping of polysilicon layers may be undertaken in-situ through co-deposition of suitable dopant species with the silicon source materials which are employed in forming the polysilicon layers. Suitable dopant species applicable to co-deposition include but are not limited to phosphine, borane and diborane. Alternatively, the polysilicon layer may be doped after it is formed through methods including but not limited to thermal diffusion methods and ion implantation methods which employ dopant species suitable to those methods.

For the two preferred embodiments of the three-dimensional polysilicon capacitor of the present invention which derive from the structure illustrated in FIG. 2a, it is critical that the first polysilicon layer 34 be made highly conductive through incorporation of dopant species into that polysilicon layer. Suitable dopant species include arsenic dopant species, boron dopant species and phosphorus dopant species. Any of the methods described above for forming and doping a polysilicon layer may be employed in forming and doping the first polysilicon layer 34. Typically, the first polysilicon layer 34 is formed through a Low Pressure Chemical Vapor Deposition (LPCVD) method employing silane or disilane as the silicon source material. The first polysilicon layer 34 is then doped through diffusion with phosphorus oxy-chloride and subsequently deglazed.

For the two preferred embodiments of the present invention which derive from the structure illustrated in FIG. 2a, the preferred thickness of the first polysilicon layer 34 is about 1500 to about 4000 angstroms. In addition, the first polysilicon layer 34 will preferably have an as-doped (in-line) resistivity of about 6 to about 9 ohm.micron. A resistivity in that range may typically be obtained through incorporating more than about 1E20 atoms per cubic centimeter dopant concentration into the first polysilicon layer 34.

Shown in FIG. 2b is an integrated circuit structure analogous to the integrated circuit structure shown in FIG. 2a with the exception that the first polysilicon layer 34 of FIG. 2a has been replaced with a multi-coating first polysilicon layer. As is shown in FIG. 2b, the multi-coating first polysilicon layer is formed upon the FOX isolation region 32 only, without contacting the semiconductor substrate 30. The multi-coating first polysilicon layer is formed from a first polysilicon coating 36 and a second polysilicon coating 40 which are separated by a metal silicide layer 38. The first polysilicon coating 36 and the second polysilicon coating 40 are formed through methods and materials analogous to the methods and materials employed in forming the first polysilicon layer 34 shown in FIG. 2a. Specifically, the first polysilicon coating 36 and the second polysilicon coating 40 are typically formed through a Low Pressure Chemical Vapor Deposition (LPCVD) method employing silane or disilane as the silicon source material. The first polysilicon coating 36 and the second polysilicon coating 40 are then doped through diffusion with phosphorus oxy-chloride and subsequently deglazed.

The first polysilicon coating 36 and the second polysilicon coating 40 will each preferably be formed to a thickness of about 1000 to about 2000 angstroms upon the FOX isolation region 32. The multi-coating first polysilicon layer which is formed from the first polysilicon coating 36 and the second polysilicon coating 40 will preferably have a resistivity in the range of about 6 to about 9 ohm.micron. A resistivity in this range may be obtained by incorporating more than about 1E20 atoms per cubic centimeter dopant concentration into the first polysilicon coating 36 and the second polysilicon coating 40.

Methods through which metal silicide layers may be formed upon semiconductor substrates are also known in the art. Such methods include but are not limited to methods whereby a silicide forming metal is deposited upon the surface of a semiconductor substrate and sintered to form a metal silicide layer with silicon surfaces with which the silicide forming metal contacts, and methods whereby metal silicides are deposited upon a semiconductor substrate through suitable metal silicide source materials. Typical silicide forming metals include but are not limited to tungsten, cobalt, titanium and platinum.

For the structure illustrated in FIG. 2b from which one of the three preferred embodiments of the present invention is derived, the metal silicide layer 38 is preferably formed upon the first polysilicon coating 36 through a sintering process whereby a silicide forming metal is formed and sintered upon the surface of the first polysilicon coating 36 to form the metal silicide layer 38. Preferably, the silicide forming metal is tungsten metal formed upon the semiconductor substrate 30 of sufficient thickness such that upon sintering with the first polysilicon coating 36 a tungsten silicide metal silicide layer 38 of thickness about 1000 to about 2000 angstroms will be formed. Other silicide forming metals may also be employed in forming the metal silicide layer 38 provided the metal silicide layer formed from the silicide forming metal is not appreciably etched by etchants which attack polysilicon layers.

Figure 3B:
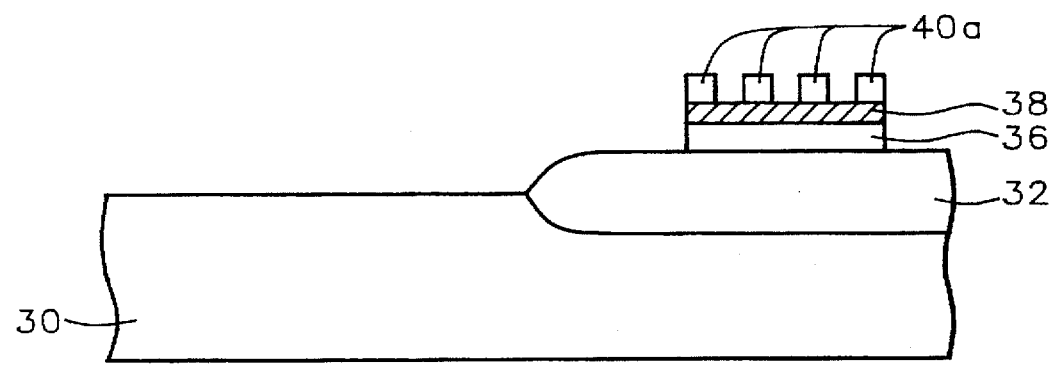
Figure 3C:
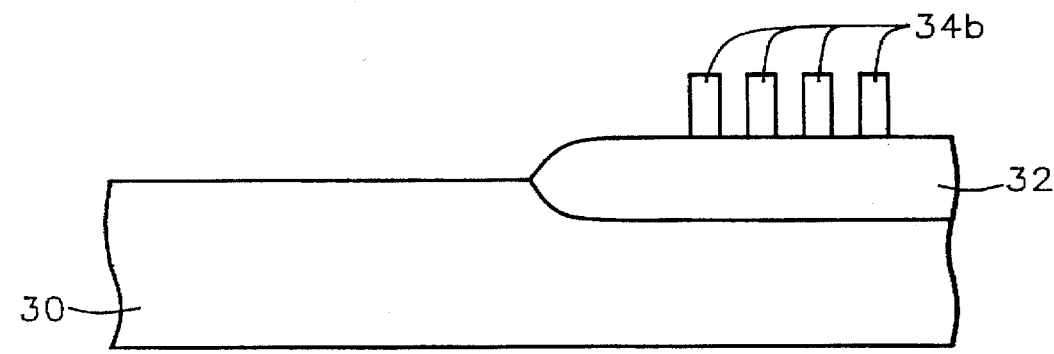

Referring now to FIG. 3a to FIG. 3c there is shown a series of cross-sectional schematic diagrams illustrating the next series of process steps in forming the three-dimensional polysilicon capacitors of the three preferred embodiments of the present invention. Shown in FIG. 3a to FIG. 3c are the results of patterning and selective etching two different portions of the first polysilicon layer 34 illustrated in FIG. 2a and one portion of the second polysilicon coating 40 illustrated in FIG. 2b.

It is critical to the present invention that the selective etching of the first polysilicon layer 34 or the second polysilicon coating 40 within the three preferred embodiments of the present invention provide a pattern of apertures into the first polysilicon layer 34 or the second polysilicon coating 40 of sufficient line-width such that: (1) a subsequent conformal insulator layer when formed into the pattern of apertures will not completely fill those apertures, and (2) a subsequent polysilicon layer, when formed upon the subsequent conformal insulator layer will fill those apertures. Under these conditions, a three dimensional polysilicon capacitor of the present invention will be formed.

FIG. 3a illustrates a partial etching of the first polysilicon layer 34 to form the patterned first polysilicon layer 34a. Analogously, FIG. 3b illustrates a more complete etching of the second polysilicon coating 40 to form the patterned second polysilicon coating 40a. In forming the patterned second polysilicon coating 40a, the metal silicide layer 38, which is preferably formed from tungsten silicide, serves as an etch stop. Although several patterns may be employed when patterning the patterned first polysilicon layer 34a within the first preferred embodiment of the present invention and the patterned second polysilicon coating 40 within the second preferred embodiment of the present invention, it is preferred that square apertures are etched into the patterned first polysilicon layer 34a and the patterned second polysilicon layer 40 for those two preferred embodiments. In order to fulfill the conformality requirements for the subsequent insulator and polysilicon layers while simultaneously maximizing the capacitance characteristics of the three-dimensional polysilicon capacitors of the first preferred embodiment and the second preferred embodiment of the present invention, the square apertures are preferably about 4000 to about 8000 angstroms on each side and about 1000 to about 2000 angstroms deep.

In contrast to FIG. 3a and FIG. 3b, FIG. 3c illustrates a more substantial etching whereby there is formed the patterned first polysilicon layer 34b from the first polysilicon layer 34 in the process of forming the three-dimensional capacitor of the third preferred embodiment of the present invention. In forming the patterned first polysilicon layer 34b, the FOX isolation region 32 serves as an etch stop. Also in contrast to FIG. 3a and FIG. 3b, the apertures formed through patterning of the first polysilicon layer 34 into the patterned first polysilicon layer 34b are preferably trench apertures. In order to fulfill the conformality requirements for the subsequent insulator and polysilicon layers while simultaneously maximizing the capacitance characteristics of the three-dimensional polysilicon capacitor of the third preferred embodiment of the present invention, the trench apertures are preferably about 4000 to about 8000 angstroms in width and the trench apertures are preferably separated by about 4000 to about 8000 angstroms.

Methods and materials through which a polysilicon layer may be patterned are known in the art. Such methods typically employ photoresist masks formed upon the polysilicon layer through which portions of the polysilicon layer may be etched. Wet chemical etchants and dry plasma etchants are common to the art. For the three preferred embodiments of the three-dimensional polysilicon capacitor of the present invention, the first polysilicon layer 34 or the second polysilicon coating 40 are preferably patterned to form the patterned first polysilicon layer 34a, the patterned first polysilicon layer 34b or the patterned second polysilicon coating 40a through Reactive Ion Etch (RIE) etching of portions of the first polysilicon layer 34 or the second polysilicon coating 40 exposed through a suitable photoresist mask. The Reactive Ion Etch (RIE) etching is preferably accomplished using a chlorine containing etchant.

Figure 4A:
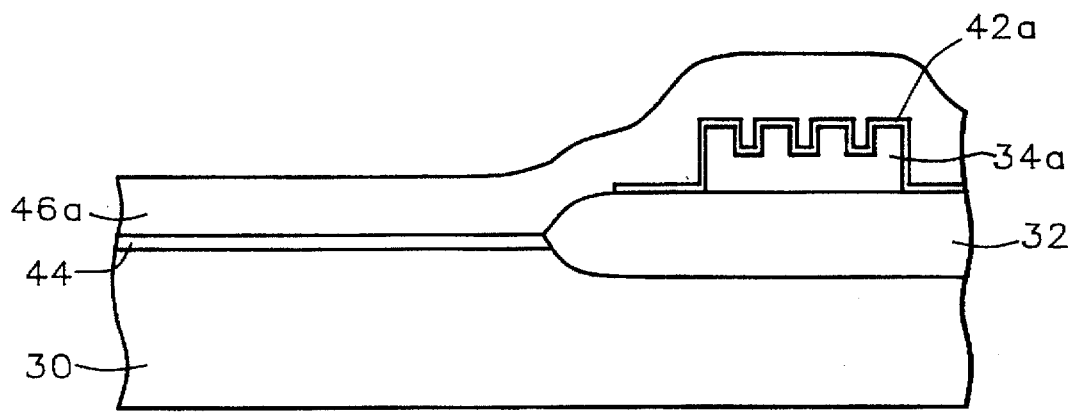
Figure 4B:
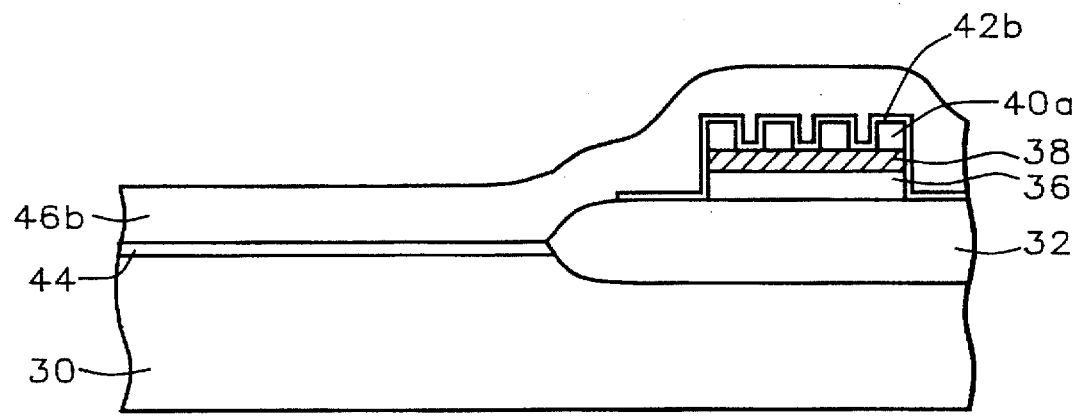
Figure 4C:
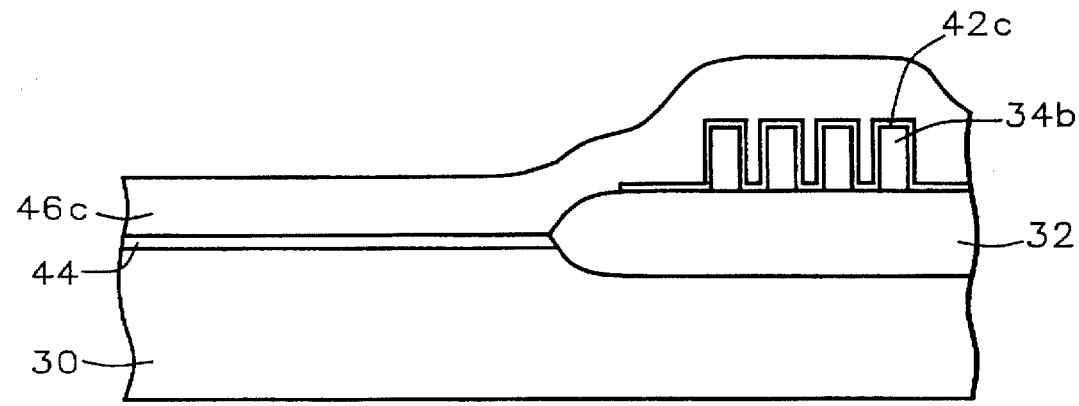

Referring now to FIG. 4a to FIG. 4c there is shown a series of cross-sectional schematic diagrams illustrating the next series of process steps in forming the three-dimensional polysilicon capacitors of the three preferred embodiments of the present invention. FIG. 4a corresponds to FIG. 3a, FIG. 4b corresponds to FIG. 3b and FIG. 4c corresponds to FIG. 3c. Illustrated in FIG. 4a to FIG. 4c, respectively, are the presence of an insulator layer 42a formed upon the surface of the patterned first polysilicon layer 34a, an insulator layer 42b formed upon the surface of the patterned second polysilicon coating 40a and an insulator layer 42c formed upon the surface of the patterned first polysilicon layer 34b.

Methods and materials through which insulator layers may be formed upon the surfaces of polysilicon layers for use within polysilicon capacitors are known in the art. Such insulator layers may be formed through methods including but not limited to Chemical Vapor Deposition (CVD) methods, Plasma Enhanced Chemical Vapor Deposition (PECVD) methods and Physical Vapor Deposition (PVD) sputtering methods. Materials from which such insulator layers may be formed include but are not limited to silicon oxides, silicon nitrides and silicon oxynitrides.

For the preferred embodiments of the present invention, the insulator layers 42a, 42b and 42c may be formed from either silicon oxide materials, silicon nitride materials, silicon oxynitride materials or alternating combinations of those materials. The insulator layers 42a, 42b and 42c may be formed upon the surfaces of their respective polysilicon layers or coating through patterning via conventional methods of a blanket insulator formed through any of the several deposition methods listed above. It is, however, critical to the performance of the three-dimensional polysilicon capacitors of the three preferred embodiments of the present invention that the insulator layers 42a, 42b and 42c be formed conformally into the apertures formed within the patterned first polysilicon layer 34a, the patterned second polysilicon coating 40a and the patterned first polysilicon layer 34b, respectively. It is also desirable for the performance of the polysilicon capacitors of the three preferred embodiments of the present invention that the insulator layers 42a, 42b and 42c have a stable, high and reproducible resistivity. For the three preferred embodiments of the present invention, the insulator layers 42a, 42b and 42c are preferably about 300 to about 600 angstroms in thickness.

Also shown within each of the schematic diagrams illustrated within FIG. 4a to FIG. 4c is the presence of a blanket gate oxide layer 44 upon the active semiconductor region of the semiconductor substrate 30. Blanket gate oxide layers are known in the art. Blanket gate oxide layers may be formed through methods including but not limited to methods whereby surfaces of active semiconductor regions are thermally oxidized to form blanket gate oxide layers and methods whereby layers of gate oxide material are deposited upon the surface of an active semiconductor region to form a blanket gate oxide layer. For the three preferred embodiments of the present invention, the blanket gate oxide layer 44 is preferably formed through a thermal oxidation process whereby the surface of the active semiconductor region of semiconductor substrate 30 is oxidized to form the blanket gate oxide layer 44.

When forming the blanket gate oxide in this fashion, it is also possible to oxidize a portion of the patterned first polysilicon layers 34a and 34b and the patterned second polysilicon coating 40a, respectively, to form at least portions of the insulator layers 42a, 42c and 42b, if the insulator layers 42a, 42b and 42c have not yet been formed upon those polysilicon layers and coating. This method may not be employed for forming the complete insulator layer 42b since the metal silicide layer 38 is not susceptible to forming an insulator layer in this fashion. Nor is this method generally preferred for forming complete insulator layers 42a and 42c since the thickness of the insulator layers 42a and 42c is typically substantially thicker than the thickness of the blanket gate oxide layer 44.

Finally, there is shown in FIG. 4a to FIG. 4c the presence of blanket second polysilicon layers 46a, 46b and 46c, respectively. The blanket second polysilicon layers 46a, 46b and 46c are preferably formed through methods and materials analogous to the methods and materials through which the first polysilicon layer 34, the first polysilicon coating 36 and the second polysilicon coating 40 are formed.

For the three preferred embodiments of the present invention, the preferred thickness of each of the blanket second polysilicon layers 46a, 46b and 46c is about 1500 to about 3000 angstroms. In addition, the blanket second polysilicon layers 46a, 46b and 46c will each preferably have a resistivity of about 6 to about 9 ohm.micron. A resistivity in that range may typically be obtained through incorporating more than about 1E20 atoms per cubic centimeter dopant concentration into each of the blanket second polysilicon layers 46a, 46b and 46c.

It is critical to the functional and reliable performance of the three-dimensional polysilicon capacitors of the three preferred embodiments of the present invention that the blanket second polysilicon layers 46a, 46b and 46c fill completely the apertures formed within the corresponding insulator layers 42a, 42b and 42c, which apertures in turn correspond to the apertures formed within the patterned first polysilicon layer 34a, the patterned second polysilicon coating 40a and the patterned first polysilicon layer 34b, respectively.

Figure 5A:
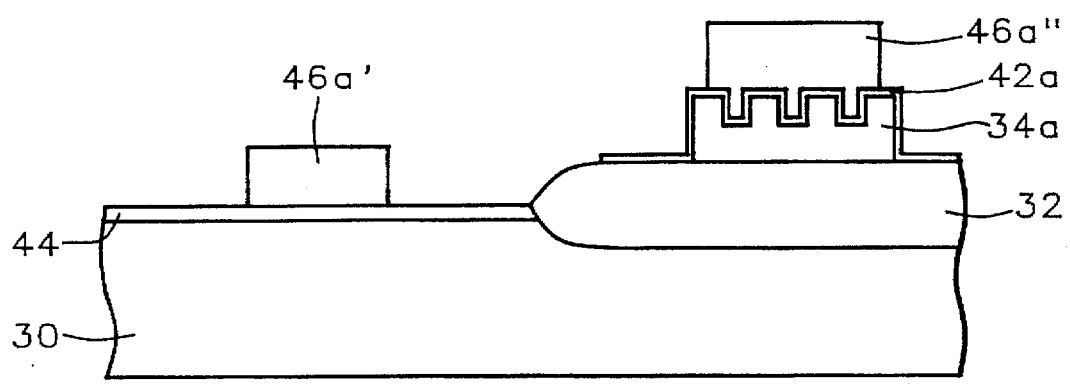
Figure 5B:
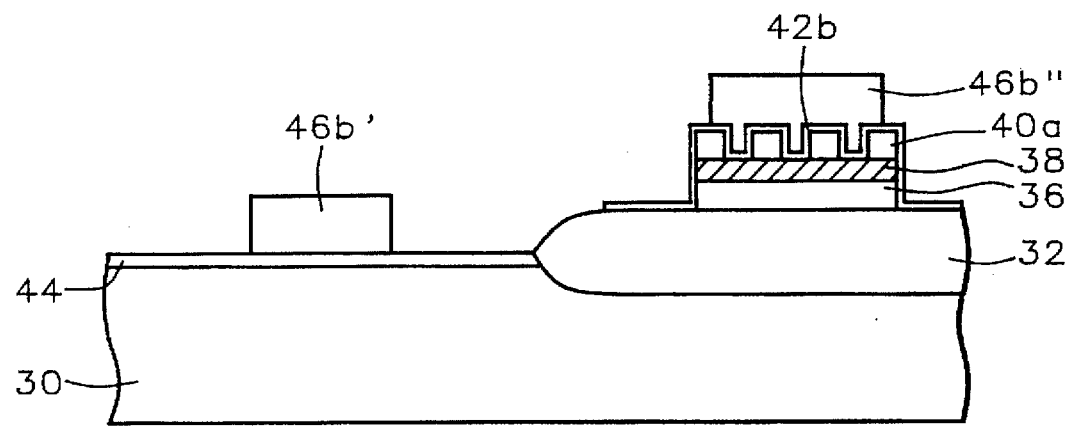
Figure 5C:
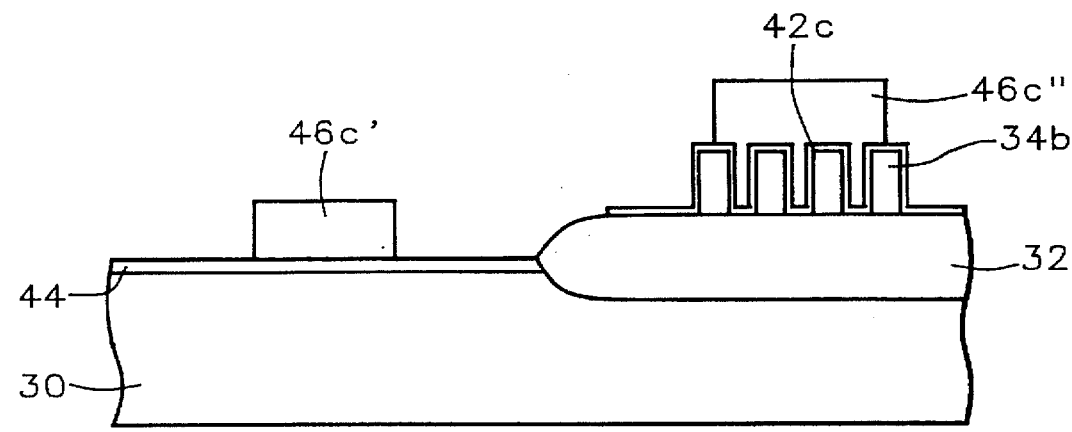

Referring now to FIG. 5a to FIG. 5c there is shown a series of cross-sectional schematic diagrams which illustrate the next process step in forming the three-dimensional polysilicon capacitors of the three preferred embodiments of the present invention within an integrated circuit. FIG. 5a corresponds to FIG. 4a, FIG. 5b corresponds to FIG. 4b and FIG. 5c corresponds to FIG. 4c. Shown in FIG. 5a is the patterning of blanket second polysilicon layer 46a to form polysilicon gate electrode 46a' and patterned second polysilicon layer 46a". Analogously, shown in FIG. 5b is the patterning of blanket second polysilicon layer 46b to form polysilicon gate electrode 46b' and patterned second polysilicon layer 46b". Finally, there is shown in FIG. 5c the patterning of blanket second polysilicon layer 46c to form polysilicon gate electrode 46c' and patterned second polysilicon layer 46c".

Within FIG. 5a, the patterned first polysilicon layer 34a, the insulator layer 42a and the patterned second polysilicon layer 46a" form the three-dimensional polysilicon capacitor which forms the first preferred embodiment of the present invention. Analogously, within FIG. 5b, the first polysilicon coating 36, the metal silicide layer 38, the patterned second polysilicon coating 40a, the insulator layer 42b and the patterned second polysilicon layer 46b" form the three-dimensional polysilicon capacitor which forms the second preferred embodiment of the present invention. Finally, within FIG. 5c, the patterned first polysilicon layer 34b, the insulator layer 42c and the patterned second polysilicon layer 46c" form the three-dimensional polysilicon capacitor which forms the third preferred embodiment of the present invention.

Figure 6:
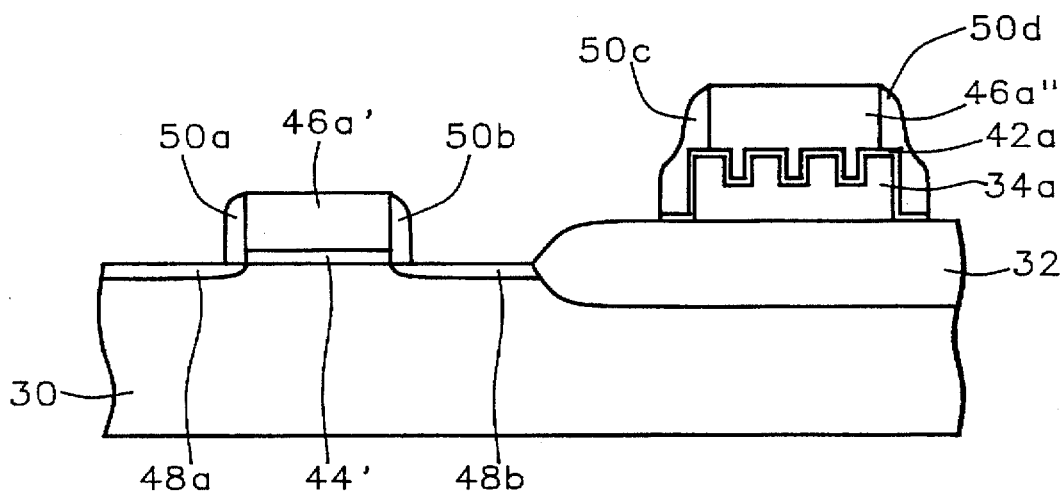
FIG. 6 and FIG. 7 show schematic cross-sectional diagrams illustrating progressive process steps in forming the three-dimensional polysilicon capacitor of the first preferred embodiment of the present invention into an integrated circuit.
Figure 7:
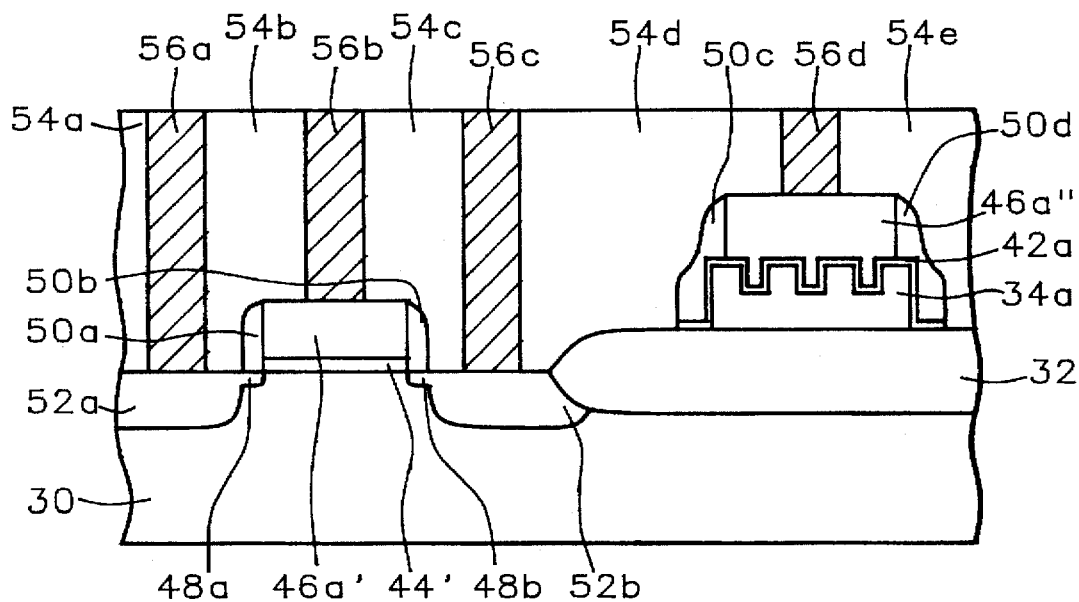

Referring now to FIG. 6 and FIG. 7 there is shown a pair of cross-sectional diagrams which illustrate the fashion by which the three-dimensional polysilicon capacitor of the first preferred embodiment of the present invention is formed into an integrated circuit. As will be understood by a person skilled in the art, the semiconductor fabrication processes through which the cross-sectional structures illustrated by FIG. 6 and FIG. 7 may be formed are applicable to the three-dimensional polysilicon capacitors of the second preferred embodiment of the present invention and the third preferred embodiment of the present invention in addition the three-dimensional polysilicon capacitor of the first preferred embodiment of the present invention. Additional detailed descriptions are not provided for forming the three-dimensional polysilicon capacitors of the second preferred embodiment of the present invention and the third preferred embodiment of the present invention into an integrated circuit since those descriptions are redundant to the description provided for the three-dimensional capacitor of the first preferred embodiment of the present invention.

Shown in FIG. 6 is the presence of low dose ion implants 48a and 48b in the semiconductor substrate 30 at locations adjoining the polysilicon gate electrode 46a' and the gate oxide layer 44'. Low dose ion implants are typically provided into semiconductor substrates in order to limit Hot Carrier Effects (HCEs). Low dose ion implants are provided into semiconductor substrates through ion implant processes which are conventional to the art. Typically, the polarity of low dose ion implants will vary according to the polarity of the transistor to be formed. Typical low dose ion implant dopant ions include but are not limited to boron dopant ions, boron difluoride dopant ions and phosphorus dopant ions.

For the preferred embodiments of the present invention, the low dose ion implants 48a and 48b may be provided into the semiconductor substrate 30 through implanting either boron dopant ions, boron difluoride dopant ions or phosphorus dopant ions preferably at an ion implant dose of about 1E13 to about 1E14 ions per square centimeter and an ion implantation energy of about 10 to about 100 keV.

Also shown in FIG. 6 is the presence of spacers 50a and 50b adjoining the polysilicon gate electrode 46a', and spacers 50c and 50d adjoining the three dimensional polysilicon capacitor of the first preferred embodiment of the present invention. Methods and materials through which spacers may be formed in integrated circuits are known in the art. Spacers are typically formed through anisotropic Reactive Ion Etch (RIE) etching of a blanket layer of spacer material. Materials from which blanket layers of spacer material may be formed include but are not limited to silicon oxide materials, silicon nitride materials and silicon oxynitride materials. Blanket layers of these materials are typically deposited through methods including but not limited to Chemical Vapor Deposition (CVD) methods, Plasma Enhanced Chemical Vapor Deposition (PECVD) methods and Physical Vapor Deposition (PVD) sputtering methods.

For the integrated circuit into which is formed the three-dimensional polysilicon capacitor of the first preferred embodiment of the present invention, the- spacers 50a, 50b, 50c and 50d are preferably formed through anisotropic Reactive Ion Etch (RIE) etching as is common in the art of a blanket layer of either silicon oxide material, silicon nitride material or silicon oxynitride material. The patterning of the blanket second polysilicon layer 46a to yield the polysilicon gate electrode 46a' and the patterned second polysilicon layer 46a", and the subsequent anisotropic Reactive Ion Etch (RIE) etching to form the spacers 50a, 50b, 50c and 50d simultaneously defines the gate oxide layer 44' of the field effect transistor within the integrated circuit within which is formed the three-dimensional polysilicon capacitor of the first preferred embodiment of the present invention.

Referring now to FIG. 7 there is shown a schematic cross-sectional diagram illustrating the last series of process steps in forming the three-dimensional polysilicon capacitor of the first preferred embodiment of the present invention into an integrated circuit. Shown in FIG. 7 is the presence of source/drain electrodes 52a and 52b which are formed into the semiconductor substrate 30 at locations adjoining the spacers 50a and 50b, respectively. Source/drain electrodes are conventional to field effect transistor design and manufacturing. Source/drain electrodes may be formed into semiconductor substrates through ion implant processes analogous to the ion implant processes employed in forming low dose ion implants into semiconductor substrates. The polarity of the low dose ion implant, when present, will dictate the polarity of the ion implant employed for forming source/drain electrodes.

For the first preferred embodiment of the present invention, the source drain electrodes 52a and 52b are formed of the same polarity as the low dose ion implants 48a and 48b, employing the same choices of dopant ions. However, the source/drain electrodes 52a and 52b are formed into the semiconductor substrate 30 at substantially different ion implantation conditions. For the preferred embodiment of the present invention, the source/drain electrodes 52a and 52b are preferably formed at an ion implantation dose of about 1E15 to about 5E15 ions per square centimeter and an ion implantation energy of about 20 to about 80 keV.

Also shown in FIG. 7 is the presence of patterned interlevel dielectric layers 54a, 54b, 54c, 54d and 54e. Patterned interlevel dielectric layers are conventional to the art of integrated circuit design and manufacturing. Patterned interlevel dielectric layers may be formed through patterning of blanket interlevel dielectric layers formed upon semiconductor substrates from insulating materials including but not limited to silicon oxides and silicon nitrides. Methods through which are formed blanket interlevel dielectric layers include but not limited to Chemical Vapor Deposition (CVD) methods, Plasma Enhanced Chemical Vapor Deposition (PECVD) methods and Physical Vapor Deposition (PVD) sputtering methods.

For the preferred embodiment of the present invention, the patterned interlevel dielectric layers 54a, 54b, 54c, 54d and 54e are preferably formed through patterning of a blanket interlevel dielectric layer formed of silicon oxide formed through a Chemical Vapor Deposition (CVD) method. Blanket interlevel dielectric layers formed through this method and material are quite common in the art. The respective apertures formed between the patterned interlevel dielectric layers 54a, 54b, 54c, 54d and 54e are etched sufficiently deeply to reach the surfaces of the source/drain electrode 52a, the polysilicon gate electrode 46a', the source/drain electrode 52b and the patterned second polysilicon layer 46a". Not shown in FIG. 7 is an additional aperture which may be etched to reach the first polysilicon layer 34a.

Finally there is shown in FIG. 7 conductive contact studs 56a, 56b, 56c and 56d formed into the apertures between the patterned interlevel dielectric layers 54a, 54b, 54c, 54d and 54e, and making contact respectively with the source/drain electrode 52a, the polysilicon gate electrode 46a', the source/drain electrode 52b and the patterned second polysilicon layer 46a". Conductive contact studs are conventional to the art of integrated circuit design and manufacture. Conductive contact studs may be formed from conductive materials such as metals, metals alloys and polysilicon, and conductive contact studs may be formed upon semiconductor substrates through methods including but not limited to thermal evaporation methods, electron beam assisted evaporation methods, Physical Vapor Deposition (PVD) sputtering methods and Chemical Vapor Deposition (CVD) methods.

For the integrated circuit into which the three-dimensional capacitor of the first preferred embodiment of the present invention is formed, the conductive contact studs 56a, 56b, 56c and 56d may be formed of any material from which conductive contact studs are typically conventionally formed. Preferably the conductive contact studs 56a, 56b, 56c and 56d are formed of tungsten metal as is most common in the art.

Upon forming the conductive contact studs 56a, 56b, 56c and 56d into the apertures between the patterned interlevel dielectric layers 54a, 54b, 54c, 54d and 54e, there is formed the three-dimensional polysilicon capacitor of the first embodiment of the present invention within an integrated circuit. The three-dimensional polysilicon capacitor of the first preferred embodiment of the present invention provides greater capacitance per unit surface area than planar polysilicon capacitors conventional to the art.

Figure 8A:
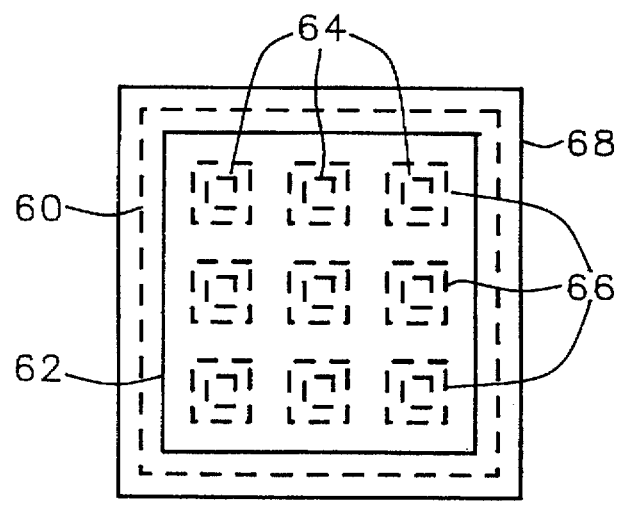
FIG. 8a and FIG. 8b show plan-view schematic diagrams of the three-dimensional capacitors of the three preferred embodiments of the present invention.
Figure 8B:
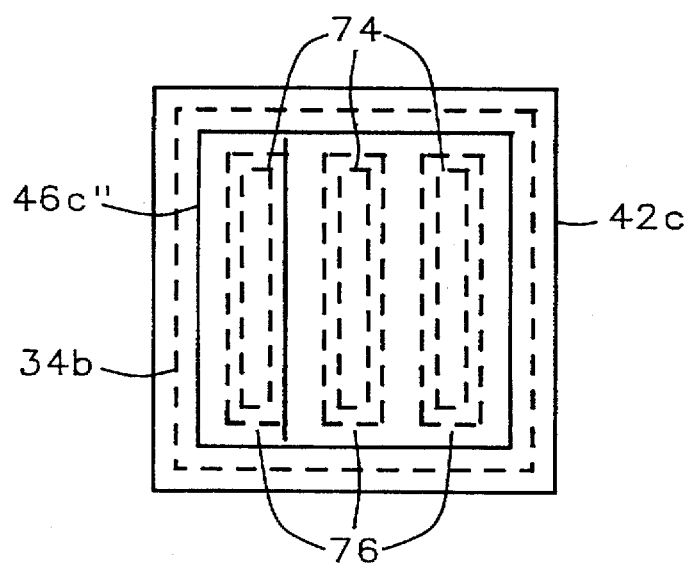

Referring now to FIG. 8a and FIG. 8b there is shown a pair of schematic plan-view diagrams which illustrate the three preferred embodiments of the three-dimensional capacitors of the present invention. The plan-view diagram of FIG. 8a corresponds to the first preferred embodiment and the second preferred embodiment of the three-dimensional capacitors of the present invention as illustrated within FIG. 5a and FIG. 5b.

Within FIG. 8a reference numeral 62 shows the outline of the upper polysilicon layer of the three-dimensional polysilicon capacitors of the first preferred embodiment or the second preferred embodiment of the present invention. This corresponds to the patterned second polysilicon layer 46a" or the patterned second polysilicon layer 46b" illustrated in FIG. 5a and FIG. 5b, respectively. Reference numeral 60 shows the outline of the lower polysilicon layer of the three-dimensional polysilicon capacitor of the first preferred embodiment or the second preferred embodiment of the present invention. This corresponds to the patterned first polysilicon layer 34a or the patterned second polysilicon coating 40a illustrated in FIG. 5a and FIG. 5b, respectively. As is shown in FIG. 8a, the areal dimensions of the upper polysilicon layer are contained within the areal dimensions of the lower polysilicon layer. Reference numeral 68 shows the outline of the insulator layer of the three dimensional polysilicon capacitor of the first preferred embodiment or the second preferred embodiment of the present invention. This corresponds to the insulator layer 42a or the insulator layer 42b illustrated in FIG. 5a and FIG. 5b, respectively. Also shown are the outlines of the square apertures 66 within the lower polysilicon layer and the outlines of the corresponding square apertures 64 within the insulator layer.

Analogously, FIG. 8b illustrates the plan-view diagram of the three-dimensional polysilicon capacitor of the third preferred embodiment of the present invention. Shown in FIG. 8b are the outlines of the patterned first polysilicon layer 34b, the insulator layer 42c and the patterned second polysilicon layer 46c" illustrated in FIG. 5c. As is shown in FIG. 8b, the areal dimensions of the patterned second polysilicon layer 46c" are contained within the areal dimensions of the patterned first polysilicon layer 34b. Also shown are the outlines of the trench apertures 76 formed within the patterned first polysilicon layer 46c" and the outlines of the corresponding trench apertures 74 formed within the insulator layer 42c.

As is understood by a person skilled in the art, the three preferred embodiments of the three-dimensional polysilicon capacitor of the present invention, and the methods and materials through which those three preferred embodiments may be formed, are illustrative of the scope of the present invention rather than limiting of the scope of the present invention. Changes to various methods, materials and structures within the three preferred embodiments of the three-dimensional polysilicon capacitors of the present invention may be made while still remaining within the scope and spirit of the present invention.

What is claimed is:

1. A method for forming a three-dimensional polysilicon capacitor for use in integrated circuits comprising:

providing a semiconductor substrate;

forming over the semiconductor substrate a first insulator layer;

forming upon the first insulator layer without contacting the semiconductor substrate a first polysilicon layer, the first polysilicon layer having a first series of apertures formed at least partially through the first polysilicon layer;

forming upon the first polysilicon layer and into the first series of apertures within the first polysilicon layer a conformal insulator layer, the conformal insulator layer having a second series of apertures formed therein corresponding to locations where the conformal insulator layer is formed into the first series of apertures within the first polysilicon layer; and forming upon the conformal insulator layer and completely filling the second series of apertures within the conformal insulator layer a second polysilicon layer, where the areal dimensions of the second polysilicon layer are contained within the areal dimensions of the first polysilicon layer.

2. The method of claim 1 wherein the first polysilicon layer has an as-doped resistivity of about 6 to about 9 ohm.micron.

3. The method of claim 2 wherein the first polysilicon layer is formed from a minimum of a single polysilicon layer formed upon the semiconductor substrate at about 1500 to about 4000 angstroms thickness.

4. The method of claim 2 wherein the first polysilicon layer is formed from a multi-coating polysilicon layer comprising two polysilicon coatings at about 1000 to about 2000 angstroms thickness each, the two polysilicon coatings being separated by a metal silicide layer.

5. The method of claim 4 wherein the metal silicide layer is a tungsten silicide layer formed between the two polysilicon coatings at a thickness of about 1000 to about 2000 angstroms.

6. The method of claim 2 wherein the individual apertures within the first series of apertures formed within the first polysilicon layer are square apertures formed partially through the first polysilicon layer, each square aperture being about 4000 to about 8000 angstroms along each edge and about 1000 to about 2000 angstroms in depth.

7. The method of claim 2 therein the individual apertures within the first series of apertures formed within the first polysilicon layer are trench apertures formed completely through the first polysilicon layer, the trenches being about 4000 to about 8000 angstroms in width, the trenches being separated by about 4000 to about 8000 angstroms.

8. The method of claim 1 wherein the conformal insulator layer has a thickness of about 300 to about 600 angstroms.

9. The method of claim 8 wherein the conformal insulator layer is formed from an insulating material chosen from the group of insulating materials consisting of silicon oxide materials, silicon nitride materials and silicon oxynitride materials.

10. The method of claim 1 wherein the second polysilicon layer has an as-doped resistivity of about 6 to about 9 ohm.micron.

11. The method of claim 10 wherein the second polysilicon layer is formed from a minimum of one polysilicon coating formed upon the conformal insulator layer at about 1500 to about 3000 angstroms thickness.

12. The method of claim 1 wherein at least one layer of the first polysilicon layer and the second polysilicon layer is employed in forming at least one other integrated circuit device structure upon the semiconductor substrate upon which is formed the three-dimensional polysilicon capacitor.

13. A three-dimensional polysilicon capacitor for use in integrated circuits comprising:

a semiconductor substrate;

an insulator layer formed over the semiconductor substrate;

a first polysilicon layer formed upon the insulator layer without contacting the semiconductor substrate, the first polysilicon layer having a first series of apertures formed at least partially through the first polysilicon layer;

a conformal insulator layer formed upon the first polysilicon layer and into the first series of apertures formed within the first polysilicon layer, the conformal insulator layer having a second series of apertures formed therein corresponding to locations where the conformal insulator layer is formed into the first series of apertures within the first polysilicon layer; and a second polysilicon layer formed upon the conformal insulator layer and completely filling the second series of apertures within the conformal insulator layer, where the areal dimensions of the second polysilicon layer are contained within the areal dimensions of the first polysilicon layer.

14. The three-dimensional polysilicon capacitor of claim 13 wherein the first polysilicon layer has a resistivity of about 6 to about 9 ohm.micron and the first polysilicon layer has a thickness of about 1500 to about 4000 angstroms thickness.

15. The three-dimensional polysilicon capacitor of claim 13 wherein the first polysilicon layer is formed from a multi-coating polysilicon layer comprising two polysilicon coatings at about 1000 to about 2000 angstroms thickness each, the two polysilicon coatings being separated by a metal silicide layer at a thickness of about 1000 to about 2000 angstroms.

16. The three-dimensional polysilicon capacitor of claim 13 wherein the individual apertures within the first series of apertures formed within the first polysilicon layer are square apertures formed partially through the first polysilicon layer, each square aperture being about 4000 to about 8000 angstroms along each edge and about 1000 to about 2000 angstroms in depth.

17. The three-dimensional polysilicon capacitor of claim 13 wherein the individual apertures within the first series of apertures formed within the first polysilicon layer are trench apertures formed completely through the first polysilicon layer, the trenches being about 4000 to about 8000 angstroms in width, the trenches being separated by about 4000 to about 8000 angstroms.

18. The three-dimensional polysilicon capacitor of claim 13 wherein the conformal insulator layer has a thickness of about 300 to about 600 angstroms.

19. The three-dimensional polysilicon capacitor of claim 13 wherein the second polysilicon layer has a resistivity of about 6 to about 9 ohm.micron and the second polysilicon layer is formed from a minimum of one polysilicon layer formed upon the conformal insulator layer at about 1500 to about 3000 angstroms thickness.

20. The three-dimensional polysilicon capacitor of claim 13 wherein at least one layer of the first polysilicon layer and the second polysilicon layer is employed in forming at least one other integrated circuit device structure upon the semiconductor substrate upon which is formed the three-dimensional polysilicon capacitor.

* * * * *